United States Patent [19]

Chao et al.

[11] Patent Number: 4,543,319

[45] Date of Patent: Sep. 24, 1985

[54] POLYSTYRENE-TETRATHIAFULVALENE POLYMERS AS DEEP-ULTRAVIOLET MASK MATERIAL

[75] Inventors: Vivian W. Chao, Yorktown Heights; Frank B. Kaufman, Amawalk; Steven R. Kramer, Peekskill; Burn J. Lin, Scarsdale, all of N.Y.

[73] Assignee: International Business Machines Corporation, Armonk, N.Y.

[21] Appl. No.: 692,010

[22] Filed: Jan. 15, 1985

Related U.S. Application Data

[63] Continuation of Ser. No. 454,811, Dec. 30, 1982, abandoned.

[51] Int. Cl.[4] .................................................. G03C 5/16
[52] U.S. Cl. ..................................... 430/312; 430/296; 430/394; 430/503; 430/287; 430/325; 430/326; 430/328; 430/942; 430/967
[58] Field of Search ............... 430/273, 296, 394, 312, 430/503, 270, 287, 325, 326, 328, 942, 967

[56] References Cited

U.S. PATENT DOCUMENTS 4,142,783  3/1979  Engler et al. ...................... 350/357
4,247,622  1/1981  Aviram ............................. 430/290 X

OTHER PUBLICATIONS

E. Bassous et al., "Acridine and Acridine Derivatives in Photoresist: Application as Deep UV Mask Materials for High Resolution Micro-Lithography", IBM Technical Disclosure Bulletin, vol. 23, No. 7B, Dec. 1980, pp. 3387-3390.

B. J. Lin, "Portable Intimately Contacted Mask", IBM Technical Disclosure Bulletin, vol. 21, No. 5, Oct. 1978, p. 2133.

B. J. Lin et al., "Practicing the Novolac Deep-UV Portable Conformable Masking Technique", *Journal of Vaccuum Science and Technology*, vol. 19, No. 4, Nov./-Dec. 1981, pp. 1313-1319.

D. C. Green and F. B. Kaufman, *IBM Technical Disclosure Bulletin*, vol. 20, No. 7, Dec. 1977, pp. 2865-2867, 2862-2864.

Donald C. Hofer, Frank B. Kaufman, Steven R. Kramer and Ari Aviram, *Applied Physics Letters*, vol. 37, No. 3, Aug. 1980, pp. 314-316.

*Primary Examiner*—John E. Kittle
*Assistant Examiner*—Cynthia Hamilton
*Attorney, Agent, or Firm*—Jackson E. Stanland

[57] ABSTRACT

A method is provided for providing a polystyrene-tetrathiafulvalene (PSTTF)/deep-ultraviolet hydrid system which combines the advantages of E-beam or X-ray lithography systems with those of deep-UV conformable printing to produce low bias, high aspect ratio resist images over the topography of microelectronic devices.

19 Claims, No Drawings

POLYSTYRENE-TETRATHIAFULVALENE POLYMERS AS DEEP-ULTRAVIOLET MASK MATERIAL

This is a continuation of application Ser. No. 454,811, filed Dec. 30, 1982 now abandoned.

TECHNICAL FIELD

This invention relates to the field of E-beam, X-ray and photonegative resist/deep-ultraviolet positive resist hybrid systems and the production of patterned thin film layers therefrom.

BACKGROUND ART

Etch resistant masks are commonly fabricated in the manufacture of integrated circuits and other microminiature electronic components. In this fabrication process a radiation sensitive layer of resist material is coated on a substrate and patternwise exposed to actinic radiation such as visible or ultraviolet light, X-rays, nuclear radiation or electrons. The irradiated regions of the resist layer undergo a chemical change which makes them either more soluble (positive resist) or less soluble (negative resist) than the non-irradiated regions. A developer is then used to preferentially remove the more soluble regions, which are the irradiated regions in a positive resist and the non-irradiated regions in a negative resist. The substrate may then be subjected to a selective processing step through the openings or windows in the resulting mask, for example, by etching or deposition.

The formation of positive resist masks from layers of radiation degradable polymers is described, for example, in U.S. Pat. No. 3,535,137. In this process a radiation degradable polymer layer is coated on a substrate and is subjected to patternwise exposure to high energy radiation such as, for example, X-rays, nuclear radiation, and electrons. The irradiated regions of the polymer undergo a decrease in molecular weight and thereby become more soluble. A developer is then used to preferentially remove the irradiated portions of the layer. The substrate can then be subjected to an additive or subtractive process such as metallization or etching with the remaining portions of the resist layer protecting the substrate from the processing.

According to U.S. Pat. No. 3,898,350, a crack-resistant electron beam positive resist is formed by coating a substrate such as a silicon dioxide wafer with a radiation degradable terpolymer derived from an alpha-olefin such as hexane-1, sulfur dioxide and a monomer selected from the group consisting of cyclopentene, bycycloheptene and methyl methacrylate and thereafter processing the coated substrate in the aforedescribed manner. A similar positive resist is disclosed in U.S. Pat. No. 3,987,215, the substrate being coated with a layer of radiation degradable polymethyl methacrylate.

In accordance with U.S. Pat. No. 3,934,057, a high sensitivity resist layer structure is disclosed which comprises a plurality of resist layers based on radiation degradable polymers each of which has a lower dissolution rate in the resist developer than the resist layer which it overlies, e.g., superimposed layers of polymethyl methacrylates having different molecular weights. U.S. Pat. No. 4,211,834 describes an etch resistant mask having high aspect ratio and resolution wherein a deep-ultraviolet sensitive resist such as an alkyl methacrylate polymer is pattern exposed through a developed mask of o-quinone diazide sensitized phenol-formaldehyde resist.

U.S. Pat. No. 3,936,530 describes a negative resist wherein a substrate coated with styrene-alkyl alcohol copolymer based polyene and polythiol components is cured by selective exposure to a free radical generating source such as actinic radiation, the unexposed portions of the coating then being dissolved away to produce a patterned surface. Other coatings employed in the production of masks or resists include polyvinyl ferrocene as disclosed in U.S. Pat. No. 4,027,052, styrene-diene block copolymer as disclosed in U.S. Pat. No. 4,061,814 and 4,4'bis(3-diazo-3,4-dihydro-4-oxo-1-naphthalenesulfonyloxy)benzil admixed with an alkali-soluble resin such as Novolac resin as disclosed in U.S. Pat. No. 4,065,306.

U.S. Pat. No. 4,132,168 describes a planographic printing plate which is imaged by exposure to ultraviolet light through a mask formed on the surface of the plate by means of a laser beam.

More recently, in accordance with U.S. patent application Ser. No. 324,303, filed Nov. 23, 1981, the entire contents of which are incorporated by reference herein, a new class of E-beam, X-ray and photoresist materials based upon electroactive polymers and a halocarbon have been developed. Reference is also made to D. Hofer and F. B. Kaufman, Appl. Phys. Lett., Vol. 37, p. 314, (1980). The electroactive polymer consists of a homopolymer or copolymer having a pi donor molecule bonded thereto through functional groups or side chains having functional groups capable of reacting with the functional groups of the donor molecule. Examples of such electroactive polymers are polystyrene, chloro-methylated styrene, polyglutamic acid, polyvinyl chloride, polyepichlorohydrin, poly (alpha halophosphazene), poly(acrylic chloride), etc. Examples of pi donor molecules are fulvalenes within the general formula:

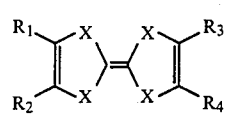

wherein X is oxygen, sulfur, selenium, tellurium or any combination thereof and $R_1$, $R_2$, $R_3$ and $R_4$ each is an organic substituent. Specific fulvalene pi donors include tetrathiafulvalene (TTF), its derivatives and Se analogs (TSeF) and its derivatives such as tetrathiafulvalenecarboxylic acid (TTFCO$_2$H), tetraselenafulvalenecarboxylic acid (TSFCO$_2$H), (hydroxymethyl)-tetrathiafulvalene (TTFCH$_2$OH), hydroxymethyl-tetraselenafulvalene (TSeFCH$_2$OH), (p-hydroxyphenyl)-tetrathiafulvalene (TTFC$_6$H$_4$OH), (p-hydroxyphenyl)-tetraselenafulvalene (TSeFC$_6$H$_4$OH), (p-aminophenyl)-tetrathiafulvalene (TTFC$_6$H$_4$NH$_2$), (p-carboxyphenyl)-tetrathiafulvalene (TTFC$_6$H$_4$CO$_2$H) and phenoxy-tetrathiafulvalene (PTTF).

In the manufacture of microelectronic devices and circuits, various fabrication techniques are used. One is a conformable masking technique as described by H. I. Smith, Rev. Sci. Instr., Vol. 40, p. 729, (1969). In this technique, a mask closely conforms to the surface topography of the substrate to be processed. This allows the mask and the wafer to be intimately contacted. As with other proximity printing techniques, very little hardware change is required to reduce the printing wavelengths to the deep-UV region (200–300 nm), so that minimum feature size and the height-to-width aspect ratio can be improved. Polychromatic exposure can be used to reduce standing waves and other interference effects as well as exposure times. Different types of resist profiles can also be produced with this technique.

However, the conformable printing technique is inherently susceptible to mask and wafer damage due to foreign particles. When the contact between the mask and the wafers is not perfect, the fringes created by any uneven mask-to-wafer gap can contribute to an uneven exposure distribution and will in turn produce uneven linewidth distributions. Because the wafer and the mask have to be safely separated during alignment, simultaneously viewing both the alignment marks on the mask and the wafer becomes a problem when a high numerical aperture alignment microscope is used to achieve high accuracy. Even after the mask and the wafer are perfectly aligned at the alignment separation, the alignment accuracy will be lost due to residual lateral movements caused by the vertical motion to bring the mask and the wafer closer for exposure.

Near-UV optical projection printing can be defect-free but cannot achieve a high aspect ratio in the photoresist image. Also, the achievable image height for projection printing systems is smaller than that for proximity printing, because a large part of the depth-of-field in the micro-fabrication projection lens is wasted in keeping the wafer in focus. Thus, while optical projection and electron beam systems inherently offer a freedom from defects and a high alignment accuracy, they both suffer from low aspect ratios in the resist image caused by focus tolerance and electron scattering, respectively.

In order to combine the advantages of projection systems with the advantages (high aspect ratio and profile-manipulating capabilities) of deep-UV conformable printing, a technique termed portable-conformable-mask technique (PCM) has been developed. This technique uses multiple resist layers, where a thin resist layer is spun on top of a thick deep-UV resist layer. The thin resist on top is chosen to be opaque for deep-UV light. It is first delineated by an optical projection or an electron beam mask aligner, and then serves as a perfect conformable mask for the bottom deep-UV resist, which can now be delineated with a blanket deep-UV exposure. The mask-wafer combination can be carried away from the mask aligner, and hence is termed "portable". The mask is no longer built on a transparent substrate as conventional masks are built. Therefore, despite the lack of suitable substrates, the blanket exposure of the PCM system can be extended to much shorter wavelengths as well. Such PCM systems are described by B. J. Lin in SPIE, Vol. 174, Developments in Semiconductor Microlithography IV, p. 114 (1979); B. J. Lin, et al J. Vac. Sci. Technol., Vol. 19, No. 4, p. 1313, Nov./Dec. 1981; B. J. Lin, et al J. Vac. Sci. Technol., Vol. 16, p. 1669 (1979); and U.S. Pat. No. 4,211,834, the teachings of all these references being hereby incorporated by reference.

As pointed out in these articles, the well known Novolac Resist System (such as AZ1350) has been used as a deep-UV portable conformable mask for polymethyl methacrylate (PMMA) in a double-layer resist system for optical and electron beam exposures. For this system, both the top and bottom resist layers are positive. Residual exposure of the bottom layer during electron beam imaging of the top layer is acceptable. However, when a negative resist is used for the top layer, the residual exposure will reduce the contrast of the bottom layer. In order to overcome this, a negative PCM system is described herein which demonstrates that if there is a sufficient sensitivity ratio between the top and bottom layers, residual exposure can be tolerated. Therefore, it is a primary object of this invention to provide a negative PCM system which is tolerant to the problem of residual exposure.

In the Novolac-PMMA system, there is an interfacial layer between the two resists. An extra plasma cleaning step is required to remove such a layer. A baking step is also required if the Novolac top resist layer is to be retained during PMMA development, as pointed out in B. J. Lin, et al, J. Vac. Sci. Technol., Vol. 19, No. 4, p. 1313, Nov./Dec. 1981.

The deep-UV PCM system described herein does not require these two steps, thereby making processing simpler. Accordingly, it is another object of this invention to provide a deep-UV PCM system in which an interfacial layer does not develop between the two resist layers.

It is another object of this invention to provide a double layer PCM system which does not require plasma cleaning or baking in order to retain the top resist layer during development of the bottom resist layer.

It is another object of the present invention to provide a PCM system in which the thin top imaging layer has a very small thickness variation over its entire area when spun on the thick resist layer.

It is another object of the present invention to provide an improved top resist layer which exhibits high resolution and sensitivity.

It is another object of the present invention to provide an improved PCM system which produces aspect-ratio amplification when the image in the top layer is replicated to the thick bottom layer.

It is a further object of this invention to provide an improved PCM system which can be used to provide a variety of resist profiles.

It is a still further object of the present invention to provide an improved PCM system in which the proximity effect produced by electron beam exposure of the top layer is reduced.

It is another object of the present invention to provide an improved PCM system in which the top layer is a negative resist and in which many different developers can be used for development of the thick bottom resist layer.

It is another object of the present invention to provide an improved PCM system in which filtering of wavelengths for exposure of the top and bottom resist layers is easier than that for previously used PCM systems.

These and other objects are accomplished by using a top imaging layer comprised of polystyrene-tetrathiafulvalene (PSTTF) polymers sensitized with halocarbons. This layer absorbs deep-UV radiation more than a Novolac film of similar thickness and can be spin coated onto a deep-UV resist. This system provides high contrast for deep-UV exposure, and provides all of the objects listed hereinabove.

SUMMARY OF THE INVENTION

In accordance with the present invention, a method is provided for providing a polystyrene-tetrathiafulvalene (PSTTF)/deep-ultraviolet hybrid system which combines the advantages of E-beam or X-ray lithography systems with those of deep-UV conformable printing to produce low bias, high aspect ratio resist images over the topography of microelectronic devices.

Broadly described, the method herein for producing a negative resist image comprises:

(a) coating a substrate with a deep-ultraviolet sensitive polymer;

(b) coating said deep-ultraviolet sensitive polymer with a halocarbon-doped electroactive polymer having the repeating unit:

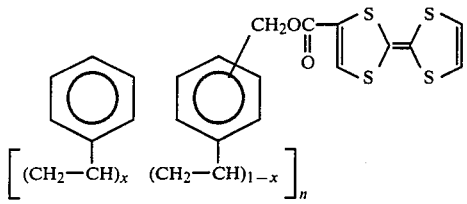

wherein the value of X is $0 < X \leq 1$ and n is from about 50 to about 10,000:

(c) pattern exposing said halocarbon-doped electroactive polymer with E-beam or X-ray radiation;

(d) developing said exposed halocarbon-doped electroactive polymer with a preferential solvent to reveal portions of the underlying deep-UV sensitive polymer;

(e) exposing said revealed portions of the underlying deep-ultraviolet sensitive polymer with deep-ultraviolet radiation; and (f) developing said exposed deep-ultraviolet sensitive polymer with a preferential solvent.

The PSTTF polymer employed in the aforedescribed method provides an excellent negative resist material giving high resolution and sensitivity. For example, features smaller than 200 nm employing an E-beam dosage of $10 \mu C/cm^2$ or X-ray energy of 50 mJ/cm$^2$ can be readily and conveniently obtained. The method of this invention is especially useful for providing a patterned PSTTF coating on a deep-UV mask substrate used in deep-ultraviolet proximity printing or projection printing mask. The method herein can also be advantageously practiced to provide a combination of PSTTF with a deep-ultraviolet resist to form a portable conformable mask.

DESCRIPTION OF THE PREFERRED EMBODIMENTS

Any of the known deep-ultraviolet sensitive polymers, e.g., polymethyl methacrylate, the alpha olefin-sulfur dioxide-cyclopentene/bicycloheptene/methyl methacrylate terpolymer of U.S. Pat. No. 3,898,350, polymethyl isopropyl ketone, etc., can be employed herein, typically on electronics grade silica as the substrate although, of course, other substrate materials are contemplated as well. The deep-ultraviolet sensitive polymer can be applied to the substrate in any number of ways with spinning from a solution of the polymer, for example, an 8-10% by weight solution of a polymethyl methacrylate of about 400,000 average molecular weight in chlorobenzene, onto the surface of the substrate followed by heat treatment to accelerate evaporation of the solvent being an especially advantageous technique. The thickness of this polymer layer can vary widely, with thicknesses from about 0.2 $\mu$m to about 10 $\mu$m, and preferably from about 0.5 $\mu$m to about 3 $\mu$m generally providing good results. The polymer can be applied to the desired thickness in a single application or can be built up from a series of successive applications.

Following application and drying of the deep-UV sensitive layer, an organic solvent solution of polystyrene-tetrathiafulvalene (PSTTF) containing a halocarbon acceptor is applied to said layer, advantageously by means of the spin casting technique, to provide a layer ranging in thickness from about 0.1 $\mu$m to about 2 $\mu$m, and preferably from about 0.2 $\mu$m to about 0.5 $\mu$m. Suitable solvents for the PSTTF include toluene, chloroform, methylene chloride, cyclopentanone, tetrahydrofuran, methyl ethyl ketone, and the like. The concentration of PSTTF in the solvent can vary widely with 8-10% by weight solutions being generally suitable. Typical halocarbon acceptors which can be used are selected from $CCL_4$, $CBr_4$, $CI_4$, $C_2Cl_6$, $C_2Cl_2Br_4$, $C_3Br_4H_4$, $C_2Br_2Cl_4$, $C_2H_2Cl_4$, $C_2Br_6$, $C_3Cl_8$, $CHBr_3$, $CHCl_3$, $CH_2Cl_2$, and the like, present in an amount ranging from about 0.01 to about 10 times the concentration of the donor moiety. The halocarbon acceptor makes the PSTTF film sensitive to radiation, such that upon exposure to E-beam or X-ray radiation, generally carried out in a vacuum, only the unexposed areas of the polymer can be removed from the underlying deep-ultraviolet sensitive polymer by washing or spraying, i.e, developing, with a selective non-polar solvent such as any of the solvents from which the PSTTF was originally applied.

When E-beam radiation is employed (scanning or blanket exposure), the charge density can advantageously be in the range of from about $1 \times 10^{-6}$ C/cm$^2$ to about $50 \times 10^{-6}$ C/cm$^2$ and preferably from about $2 \times 10^{-6}$ C/cm$^2$ to about $30 \times 10^{-6}$ C/cm$^2$. When X-ray radiation is employed, a dose of about 10 mJ/cm$^2$ to about 100 mJ/cm$^2$, and preferably of about 25 mJ/cm$^2$ to about 65 mJ/cm$^2$, can be used with good results.

Following removal of the unexposed portions of the PSTTF layer, the underlying areas of the deep-UV sensitive polymer are blanket exposed with deep-UV radiation (from about 200 to about 260 nm wavelength), advantageously at a charge density from about 100 mJ/cm$^2$ to about 2000 mJ/cm$^2$, and preferably from about 500 mJ/cm$^2$ to about 1000 mJ/cm$^2$. The exposed portions of the polymer are thereafter removed with a selective solvent therefor, e.g., methyl isobutyl ketone, to provide the negative resist herein.

If desired, the PSTTF mask can be recycled, e.g., employing known oxygen plasma cleaning techniques. Other additive or subtractive operations such as metallization can also be carried out employing procedures which are well known in the art.

The following example is further illustrative of the method of the invention:

EXAMPLE

A silicon dioxide wafer was coated to a total thickness of 2.4 $\mu$m with a polymethyl methacrylate (PMMA) of 500,000 average molecular weight. The PMMA was applied by spin coating at 1,000 rpm from a 10% by weight solution of the polymer in 2-methoxyethyl ether (diglyme) to provide an initial 1.2 $\mu$m layer upon drying. Following baking at 85° C. for 20 minutes, another 1.2 $\mu$m thickness (upon drying) of the PMMA was applied followed by baking at 160° C. for 1 hour.

A polystyrene-tetrathiafulvalene (PSTTF) layer of 0.6 $\mu$m thickness (upon drying) was applied to the PMMA layer by spin coating at 2,500 rpm from a 20 $\mu$l cyclopentanone solution of 4.7 mg PSTTF and 1 mg $C_2Br_2Cl_4$ as the halocarbon acceptor. Following evaporation of the cyclopentanone (without baking), the PSTTF was exposed to scanning E-beam radiation at a charge density of about 10 μ $C/cm^2$. Comparable results can be achieved employing X-ray radiation at a dosage level of 50 $mJ/cm^2$.

Following removal of the unexposed regions of the PSTTF with tetrahydrofuran, the underlying portions of the PMMA layer were blanket exposed with 800 $mJ/cm^2$ of deep-ultraviolet radiation (200–260 nm wavelength) and the exposed PMMA was removed with methyl isobutyl ketone to provide the negative resist of this invention.

Additional operations, optional in nature, included ashing in a forming gas plasma in a barrel reactor at 200 watts and 0.13 torr for 10 minutes followed by evaporation of 0.8 μm aluminum and lift-off of the aluminum in trichloroethylene.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for producing a negative resist image which consists of:
   (a) coating a substrate with a deep-ultraviolet sensitive polymer;
   (b) coating said deep-ultraviolet sensitive polymer with an undyed halocarbon-doped electroactive polymer having the repeating unit:

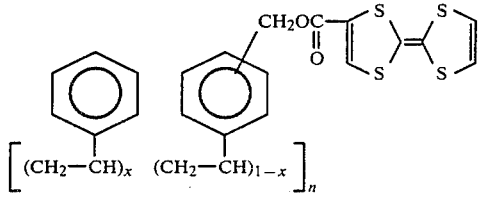

wherein the value of X is $0 \leq X < 1$ and n is from about 50 to about 10,000;
   (c) pattern exposing said halocarbon-doped electroactive polymer with E-beam or X-ray radiation;
   (d) developing said exposed halocarbon-doped electroactive polymer with a preferential solvent to reveal portions of the underlying deep-ultraviolet sensitive polymer;
   (e) exposing said revealed portions of the underlying deep-ultraviolet sensitive polymer with deep-ultraviolet radiation; and
   (f) developing said exposed deep-ultraviolet sensitive polymer with a preferential solvent.

2. The method of claim 1 wherein the halocarbon is selected from the group consisting of $CCl_4$, $CBr_4$, $CI_4$, $C_2Cl_6$, $C_2Cl_2Br_2$, $C_3Br_4H_4$, $C_2Br_2Cl_4$, $C_2H_2Cl_4$, $C_2Br_6$, $C_3Cl_8$, $CHBr_3$ and $CH_2Cl_2$.

3. The method of claim 2 wherein the halocarbon is present at a level of from 0.01 to 10 times the concentration of the tetrathiafulvalene moiety of the electroactive polymer.

4. The method of claim 1 wherein X in said electroactive polymer has the value 1.

5. The method of claim 1 wherein n in said electroactive polymer has an average value of about 100.

6. The method of claim 1 wherein the deep-UV sensitive polymer is applied to a total thickness of from about 0.2 μm to about 10 μm.

7. The method of claim 1 wherein the deep-UV sensitive polymer is applied to a total thickness of from about 0.5 μm to about 3 μm.

8. The method of claim 1 wherein the deep-UV sensitive layer is an alkyl methacrylate polymer.

9. The method of claim 8 wherein the alkyl methacrylate polymer is a polymethyl methacrylate.

10. The method of claim 9 wherein the polymethyl methacrylate possesses an average molecular weight of from about 30,000 to about 2,000,000.

11. The method of claim 1 wherein the deep-UV sensitive layer is applied by spin coating from an organic solvent solution of the polymer.

12. The method of claim 11 wherein the deep-UV sensitive layer is a polymethyl methacrylate applied from a solution of 2-methoxyethyl ether.

13. The process of claim 1 wherein the electroactive polymer layer is exposed to E-beam radiation for a charge density in the range of from about $1 \times 10^{-6}$ $C/cm^2$ to about $50 \times 10^{-6}$ $C/cm^2$.

14. The process of claim 1 wherein the electroactive polymer layer is exposed to E-beam radiation for a charge density in the range of from about $1 \times 10^{-6}$ $C/cm^2$ to about $50 \times 10^{-6}$ $C/cm^2$.

15. The process of claim 1 wherein the electroactive polymer is exposed to X-ray radiation for a dose of from about 10 $mJ/cm^2$ to about 100 $mJ/cm^2$.

16. The process of claim 1 wherein the deep-UV sensitive polymer is exposed to deep-UV radiation at a charge density of from about 100 $mJ/cm^2$ to about 2000 $mJ/cm^2$.

17. The process of claim 1 wherein the electroactive polymer upon irradiation is developed with tetrahydrofuran.

18. The process of claim 1 wherein the electroactive polymer upon irradiation is developed with cyclopentanone.

19. The process of claim 1 wherein the deep-UV sensitive polymer is a polymethyl methacrylate which upon irradiation is developed with methyl isobutyl ketone.

* * * * *